United States Patent
Mura et al.

(10) Patent No.: US 6,366,182 B1
(45) Date of Patent: Apr. 2, 2002

(54) LADDER-TYPE PIEZOELECTRIC FILTER HAVING A SUBSTANTIALLY SQUARE RESONATOR WITH THE FOUR CORNERS CUT

(75) Inventors: Hideo Mura, Hakui; Takashi Shimura, Toyama, both of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/317,661

(22) Filed: May 24, 1999

(30) Foreign Application Priority Data

Jun. 26, 1998 (JP) .......................... 10-179484

(51) Int. Cl.$^7$ ................... H03H 9/205; H03H 9/58
(52) U.S. Cl. ......................... 333/189; 310/367
(58) Field of Search ................ 333/186, 187, 333/188, 189, 190, 192; 310/348, 352, 367, 368

(56) References Cited

U.S. PATENT DOCUMENTS

| 5,130,680 A | * | 7/1992 | Nagai et al. ............. 333/188 X |
| 5,426,401 A | * | 6/1995 | Ogawa et al. ............... 333/188 |
| 5,543,763 A | * | 8/1996 | Oyama ....................... 333/189 |
| 5,574,414 A | * | 11/1996 | Ogawa et al. .............. 333/189 |
| 5,736,911 A | * | 4/1998 | Watanabe .................... 333/188 |

FOREIGN PATENT DOCUMENTS

| JP | 52-63046 | * | 5/1977 | ................. 333/189 |
| JP | 53-77439 | * | 7/1978 | ................. 333/189 |
| JP | 53-79398 | * | 7/1978 | |
| JP | 53-90844 | * | 8/1978 | ................. 333/189 |
| JP | 62-10912 | * | 1/1987 | ................. 333/190 |
| JP | 5-63501 | * | 3/1993 | ................. 333/190 |
| JP | 8-102642 | * | 4/1996 | |

* cited by examiner

*Primary Examiner*—Robert Pascal
*Assistant Examiner*—Barbara Summons
(74) *Attorney, Agent, or Firm*—Keating & Bennett, LLP

(57) ABSTRACT

A ladder-type piezoelectric filter includes two parallel resonators to vibrate in a square type vibration mode, each of which has a substantially square shape, and two series resonators adapted to vibrate in a square type vibration mode, each of which has a substantially square shape and has a corner cut portion located at each of four corners. The parallel and series resonators have substantially equal distances between respective opposite side edges thereof and are made from materials having the same frequency constant. The parallel and series resonators are housed within a housing and are aligned at approximate centers thereof.

13 Claims, 6 Drawing Sheets

Series Resonator

Series Resonator

Parallel Resonator

Series Resonator

Parallel Resonator

Series Resonator

Parallel Resonator

Series Resonator

Parallel Resonator

Series Resonator

Parallel Resonator

LADDER-TYPE PIEZOELECTRIC FILTER HAVING A SUBSTANTIALLY SQUARE RESONATOR WITH THE FOUR CORNERS CUT

BACKGROUND OF THE INVENTION

1. Field of the Invention

The present invention relates to a ladder-type piezoelectric filter including a series resonator and a parallel resonator which are connected so as to define a ladder-type circuit.

2. Description of the Related Art

In a conventional ladder-type piezoelectric filter, square-shaped piezoelectric elements adapted to vibrate in a square type vibration mode are used as a series resonator and a parallel resonator. The resonators are stacked in layers in a thickness direction with terminal plates disposed therebetween.

As shown in FIG. 1, the ladder-type filter obtains a desired filter characteristic by utilizing the impedance characteristic of the parallel resonator at the resonance frequency Fr and the impedance characteristic of the series resonator at the antiresonance frequency Fa.

For example, in order to obtain a filter having a center frequency of 455 kHz (Δf=20), a series resonator having a Fr of 455 kHz and a parallel resonator having a Fr of 435 kHz are produced. If the series resonator and the parallel resonator are made from a material having a frequency constant of 2000 kHz.mm, the series and parallel resonators have the following dimensions:

Series resonator: 2000÷455=4.396 mm

Parallel resonator: 2000÷435=4.598 mm

Thus, a dimensional difference of about 0.2 mm occurs between the series resonator and the parallel resonator.

Since the series and parallel resonators are contained within the same housing, the housing is made so as to accommodate the larger parallel resonator, resulting in a displacement between the center of the parallel resonator and the center of the series resonator.

As described above, when series and parallel resonators having a square shape are made from materials having the same frequency constant, the series and parallel resonators have different sizes. As a result, when the series and parallel resonators are housed, their respective centers do not align with each other. A square-shaped resonator adapted to vibrate in a square type vibration mode must be held at the center thereof by a terminal plate. Otherwise, proper vibration is hindered and a filter characteristic curve is distorted.

A square-shaped resonator adapted to vibrate in a square type vibration mode causes a main impedance variation at Fa and Fr and a spurious impedance variation at a higher frequency. When square resonators of a square type vibration mode are used as the series and parallel resonators, the spurious impedance variations are superposed on each other, resulting in an undesirable filter characteristic.

SUMMARY OF THE INVENTION

To overcome the above described problems, one of the preferred embodiments of the present invention provides a ladder-type piezoelectric filter including a first piezoelectric element adapted to vibrate in a square type vibration mode having a substantially square shape and functioning as a parallel resonator, and a second piezoelectric element which functions as a series resonator and is adapted to vibrate in a square type vibration mode, the second piezoelectric element being made from a material having a frequency constant that is substantially equal to that of a material from which the first element is made, the second piezoelectric element having a substantially square shape such that a distance between opposite side edges thereof is substantially equal to that of the first piezoelectric element and such that each of four corners of the second piezoelectric element is cut.

When a substantially square-shaped series resonator and a substantially square parallel resonator are made from materials having the same frequency constant, the resulting series and parallel resonators differ in size. However, when a substantially square-shaped resonator is used as a parallel resonator and a substantially square-shaped resonator having corner cuts is used as a series resonator as described above, the resonance frequency of the parallel resonator differs from that of the series resonator even though the parallel and series resonators have substantially equal distances between respective opposite side edges thereof, so that a desired ladder-type filter is achieved.

Another preferred embodiment of the present invention provides a ladder-type piezoelectric filter including a first piezoelectric element adapted to vibrate in a square type vibration mode having a substantially square shape and functioning as a parallel resonator, and a second piezoelectric element functioning as a series resonator, adapted to vibrate in a square type vibration mode and made from a material having a frequency constant that is substantially equal to that of a material from which the first piezoelectric element is made, the second piezoelectric element having a substantially square shape such that a distance between opposite side edges thereof is substantially equal to that of the first piezoelectric element and such that each nodal portion located at an approximate central portion of each of the side edges is cut.

A further preferred embodiment of the present invention provides a ladder-type piezoelectric filter including a first piezoelectric element adapted to vibrate in a square type vibration mode, having a substantially square shape such that each of four corners thereof is cut, and functioning as a series resonator, and a second piezoelectric element functioning as a parallel resonator, adapted to vibrate in a square type vibration mode, being made from a material having a frequency constant that is substantially equal to that of a material from which the first piezoelectric element is made, the second piezoelectric element having a substantially square shape such that a distance between opposite side edges thereof is substantially equal to that of the first piezoelectric element and such that each of a nodal portion located at an approximate central portion of each of side edges thereof is cut.

In such a ladder-type filter including resonators of two different kinds which have substantially equal distances between respective opposite side edges thereof, the parallel and series resonators can be housed in a center-aligned arrangement, thereby preventing hindrance to proper vibration and distortion of a filter characteristic curve.

In the case of a square resonator of a square type vibration mode, a spurious impedance variation appears at a frequency higher than that of a main impedance variation. In the case of a resonator having nodal cuts, a spurious impedance variation shifts toward the higher-frequency side as compared with the case of the square resonator. In the case of a resonator having corner cuts, a spurious impedance variation shifts toward the lower-frequency side as compared with the case of the square resonator. Through a combination of series and parallel resonators of different shapes as in the cases of the preferred embodiments described above, superposition of the respective spurious impedance variations can be prevented, thereby providing a greatly improved characteristic in relation to spurious impedance variation.

An additional preferred embodiment of the present invention provides a ladder-type piezoelectric filter including a first piezoelectric element adapted to vibrate in a square type vibration mode, having a substantially square shape such that each of four corners thereof is cut, and functioning as a series resonator, and a second piezoelectric element functioning as a parallel resonator, adapted to vibrate in a square type vibration mode, being made from a material having a frequency constant that is substantially equal to that of a material from which the first piezoelectric element is made, the second piezoelectric element having a substantially square shape such that a distance between opposite side edges thereof is substantially equal to that of the first piezoelectric element and such that each of four corners thereof is cut in which each of the cut portions of the second piezoelectric element is narrower than each of the cut portions of the first piezoelectric element.

As in the case of the above described ladder-type piezoelectric filter, the parallel and series resonators can be housed in a center-aligned arrangement, and superposition of the respective spurious impedance variations can be prevented. Since the element having wide corner cuts is higher in resonant frequency than the element having narrow corner cuts, the element having wide corner cuts is used as the series resonator, and the element having narrow corner cuts is used as the parallel resonator.

An additional preferred embodiment of the present invention provides a ladder-type piezoelectric filter including a first piezoelectric element adapted to vibrate in a square type vibration mode, having a substantially square shape such that each of a nodal portion located at an approximate central portion of each of side edges thereof is cut, and functioning as a series resonator, and a second piezoelectric element functioning as a parallel resonator and adapted to vibrate in a square type vibration mode, being made from a material having a frequency constant which is substantially equal to that of a material from which the first piezoelectric element is made, having a substantially square shape such that a distance between opposite side edges is substantially equal to that of the first piezoelectric element and such that each of a nodal portion located at an approximate central portion of each of side edges is cut deeper than that of the first piezoelectric element.

The above-described ladder-type piezoelectric filter achieves the advantages and effects similar to those of the ladder-type filter of the first preferred embodiment described above.

Since the element having shallow cuts is higher in resonant frequency than the element having deep cuts, the element having shallow cuts is used as the series resonator, and the element having deep cuts is used as the parallel resonator.

Other features and advantages of the present invention will become apparent from the following description of preferred embodiments of the present invention which refers to the accompanying drawings.

DETAILED DESCRIPTION OF PREFERRED EMBODIMENTS

Figure 1:
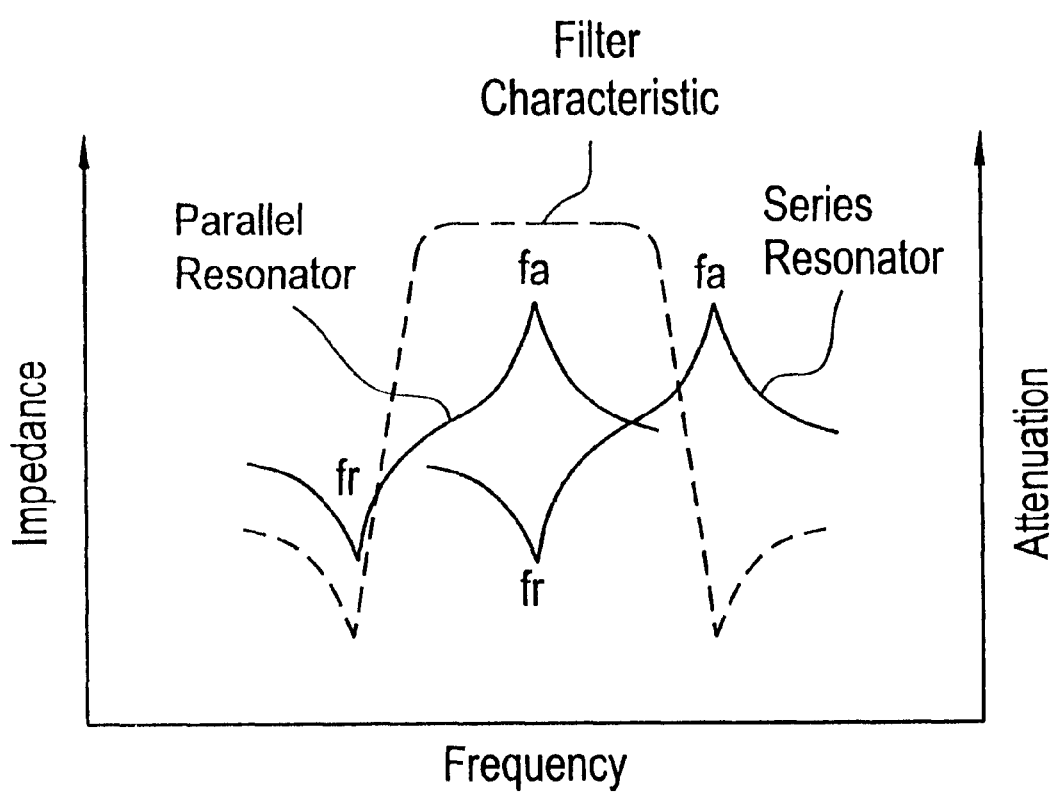
FIG. 1 is a graph showing an impedance characteristic of a series resonator and that of a parallel resonator and a filter characteristic of a ladder-type filter.
Figure 2:
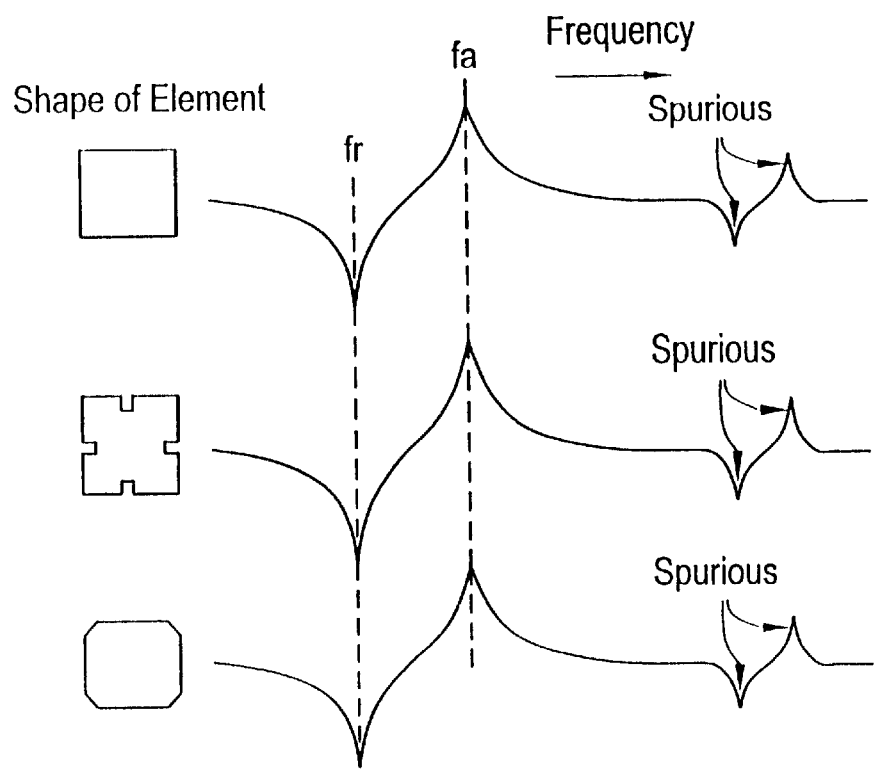
FIG. 2 is a comparative chart of an impedance characteristic among elements of a square type vibration mode and of different shapes.
Figure 3:
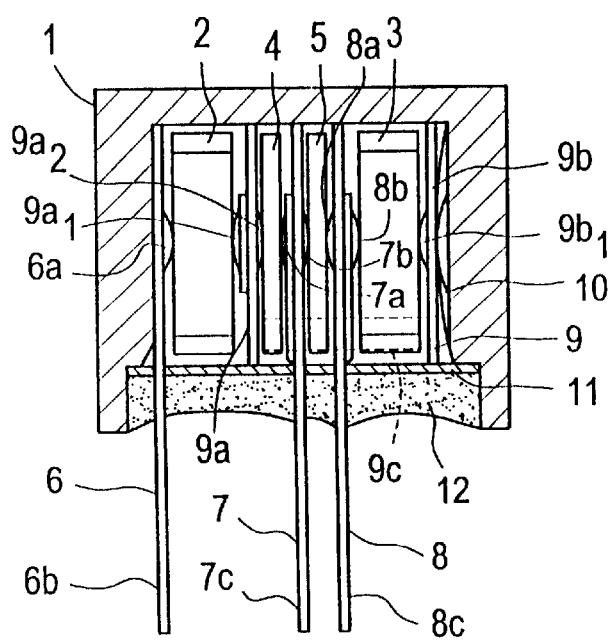
FIG. 3 is a sectional view showing a ladder-type piezoelectric filter according to a first preferred embodiment of the present invention.
Figure 4:
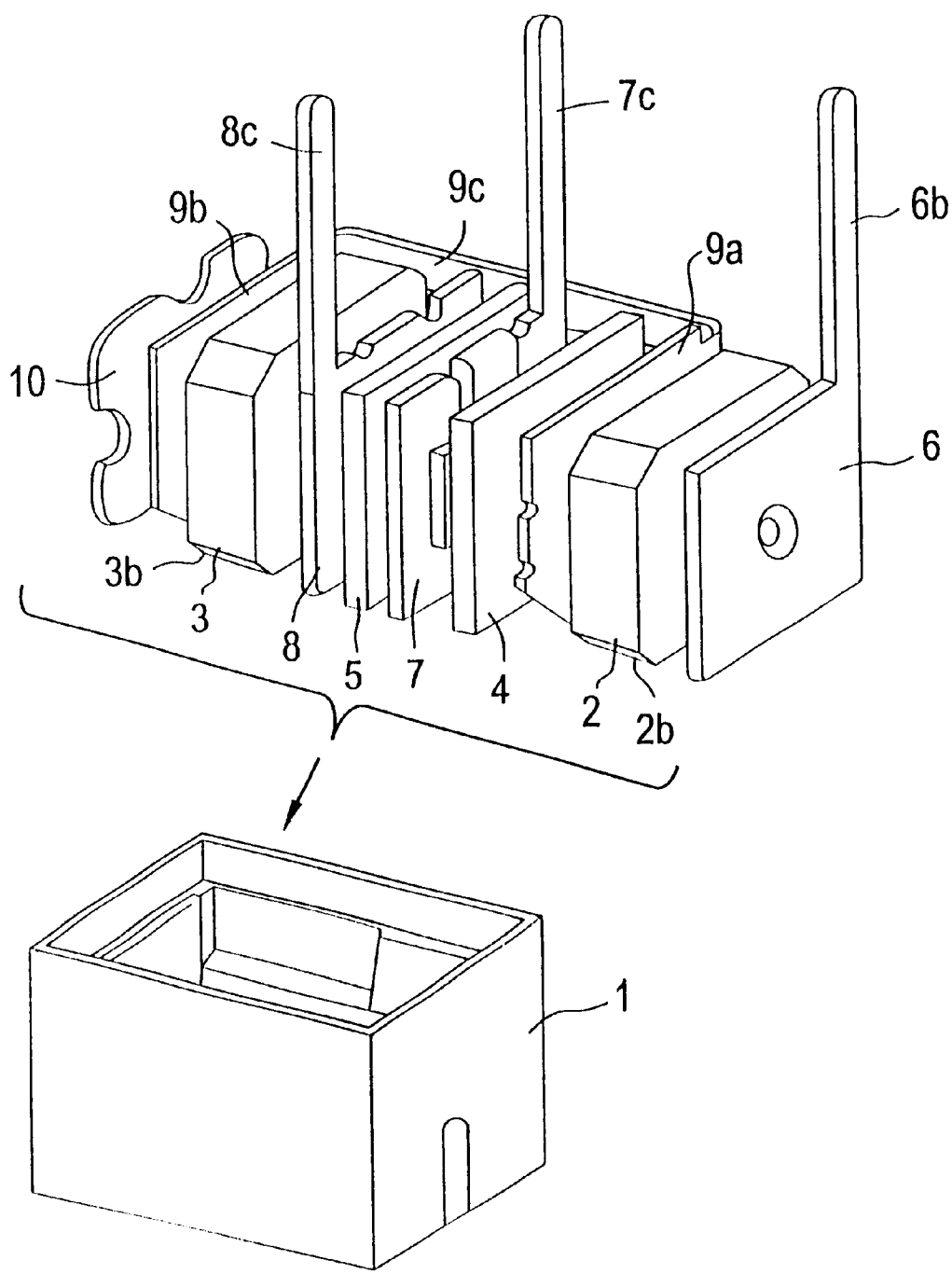
FIG. 4 is an exploded perspective view showing the ladder-type piezoelectric filter of FIG. 3.

FIGS. 3 and 4 show a ladder-type piezoelectric filter according to one preferred embodiment of the present invention.

Figure 5:
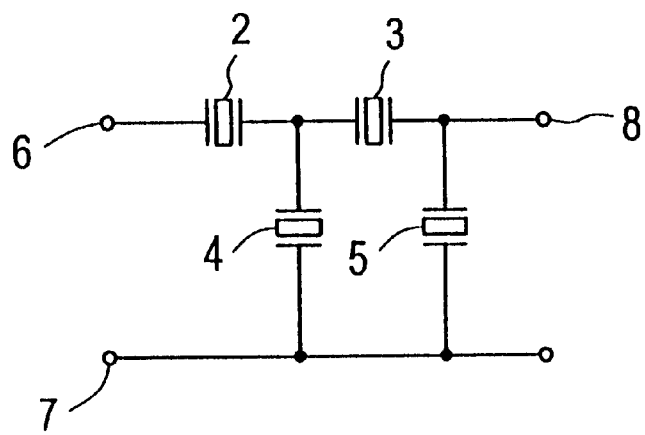
FIG. 5 is a circuit diagram showing the ladder-type piezoelectric filter of FIG. 3.

In the present preferred embodiment, the ladder-type piezoelectric filter preferably includes at least four elements and is configured as a ladder-type circuit as shown in FIG. 5. A box-type housing 1 includes two series ceramic resonators 2 and 3, two parallel ceramic resonators 4 and 5, an input terminal 6, a grounding terminal 7, an output terminal 8, a connecting terminal 9, and a spring plate 10. A sheet 11 is fitted into an opening of the housing 1. Resin 12 is injected into a concave space defined by the sheet 11 and the opening to thereby seal the opening.

A projection 6a is provided on one side of the input terminal 6 and is in pressure contact with a central portion of the series resonator 2. Two projections 7a and 7b are provided on the opposite sides of the grounding terminal 7 and are in pressure contact with the two parallel resonators 4 and 5 at the corresponding central portions. Two projections 8a and 8b are provided on the opposite sides of the output terminal 8 and are in pressure contact with the parallel and series resonators 5 and 3, respectively, at the corresponding central portions. The connecting terminal 9 includes a portion 9a inserted between the series resonator 2 and the parallel resonator 4, a portion 9b located between the series resonator 3 and the spring plate 10, and a connecting portion 9c that connects the portions 9a and 9b. Projections $9a_1$ and $9a_2$ are provided on the opposite sides of the portion 9a and are in pressure contact with the series resonator 2 and the parallel resonator 4, respectively, at the corresponding central portions. A projection $9b_1$ is provided on one side of the portion 9b and is in pressure contact with the series resonator 3 at a central portion. The spring plate 10 is interposed between the portion 9b and the inner wall of the housing 1. The terminals 6 to 9 and the resonators 2–5 are thus pressed against each other, thereby establishing electrical connection therebetween.

Lead portions 6b, 7c, and 8c extend from the input terminal 6, the grounding terminal 7, and the output terminal 8, respectively, and project from the open portion of the housing 1 into the exterior thereof in order to define external connections.

Figure 6A:
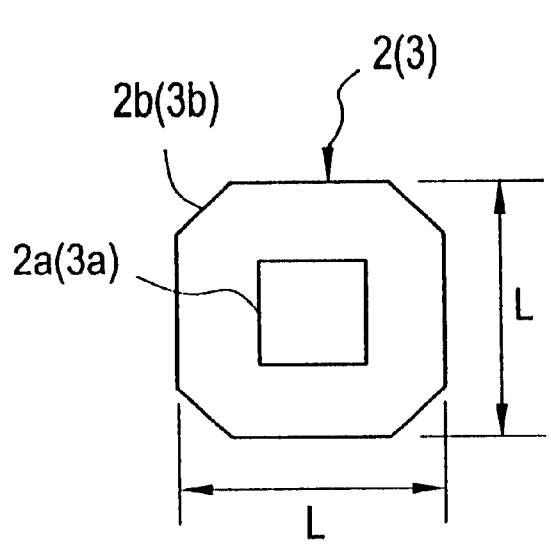
FIGS. 6A and 6B are respective front views of a series resonator and a parallel resonator for use in the ladder-type piezoelectric filter of FIG. 3.
Figure 6B:
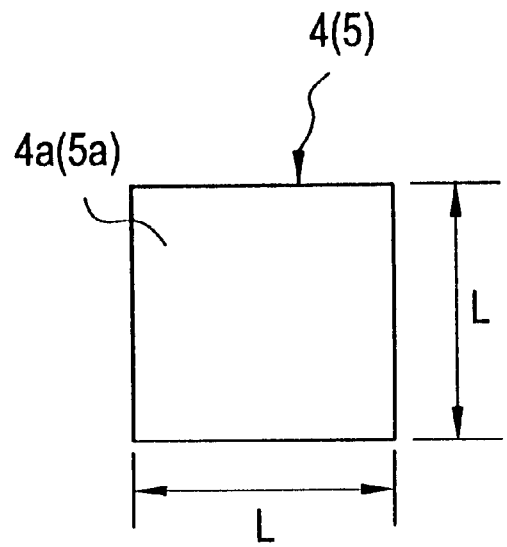

The series resonators 2 and 3 and the parallel resonators 4 and 5 are piezoelectric resonators utilizing a square type vibration mode and are preferably made from the same ceramic material of a certain desired frequency constant. As shown in FIGS. 6A and 6B, partial electrodes 2a (3a) are disposed on the opposite sides of the series resonator 2 (3), and full electrodes 4a (5a) are disposed on the opposite sides of the parallel resonator 4 (5). The series resonator 2 (3) is thicker than the parallel resonator 4 (5), and the distance L between the opposite side edges of the series resonator 2 (3) is substantially equal to that of the parallel resonator 4 (5).

By making the series resonator 2 (3) thicker than the parallel resonator 4 (5) and making the area of the electrode of the series resonator 2 (3) smaller than that of the parallel resonator 4 (5) as described above, a desired capacitance ratio between the parallel resonator 4 (5) and the series resonator 2 (3) is obtained, thereby achieving a desired attenuation outside of a pass band.

Four corners of the series resonator 2 (3) are ground to define corner cuts 2b (3b), thereby establishing a predetermined frequency difference between the series resonator 2 (3) and the parallel resonator 4 (5) for achieving frequency adjustment.

For example, when a parallel resonator having a $\Delta f$ of 20 kHz and having a Fr of 435 kHz is made from a material having a frequency constant of 2000 kHz.mm, the distance L between the opposite side edges is calculated as follows:

$$L = 2000 \div 435 = 4.598 \text{ mm}$$

If a series resonator is made such that the distance L becomes equal to that of the parallel resonator, the Fr of the series resonator will have a value of 435 kHz. Therefore, in order to adjust the Fr of the series resonator to a value of 455 kHz, the series resonator is cut at corners for adjustment by an amount corresponding to 20 kHz.

In a ladder-type filter configured as above, the series resonators 2 and 3 and the parallel resonators 4 and 5 have substantially the same distance L between respective opposite side edges thereof. Being housed within the housing 1, the series resonators 2 and 3 and the parallel resonators 4 and 5 are aligned with respect to their centers. The projection of the input terminal 6, the projection of the grounding terminal 7, the projection of the output terminal 8, and the projection of the connecting terminal 9 are pressed against the series resonators 2 and 3 and the parallel resonators 4 and 5 at the corresponding central portions, thereby preventing hindrance to proper vibration and a distortion of a filter characteristic curve.

In the series resonators 2 and 3 and the parallel resonators 4 and 5, a spurious impedance variation appears at a frequency higher than that of the main impedance variation. However, since the shape of the series resonators 2 and 3 differ from that of the parallel resonators 4 and 5, a frequency at which the spurious impedance variation appears differs between the series resonators 2 and 3 and the parallel resonators 4 and 5, so that the spurious impedance variations are not superposed. The ladder-type filter, therefore, achieves an excellent characteristic in relation to spurious impedance variation.

Figure 7A:
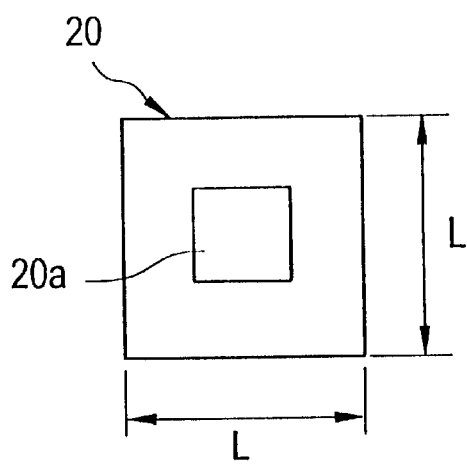
FIGS. 7A and 7B are respective front views of a series resonator and a parallel resonator for use in a ladder-type piezoelectric filter according to a second preferred embodiment of the present invention.
Figure 7B:
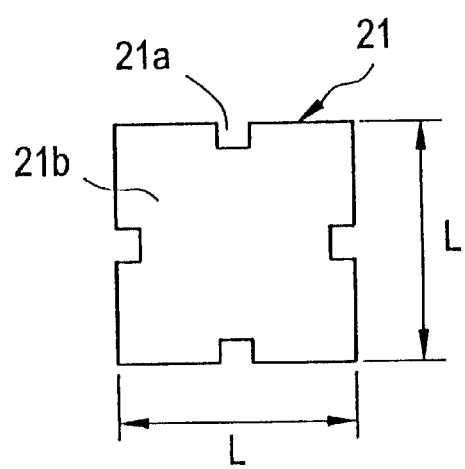

FIGS. 7A and 7B show a series resonator and a parallel resonator applied to a ladder-type filter according to a second preferred embodiment of the present invention.

In the present preferred embodiment, a square-shaped piezoelectric element is used as a series resonator 20, and a piezoelectric element having a nodal cut 21a formed at a central portion of each of four side edges is used as a parallel resonator 21.

Each of the series resonator 20 and the parallel resonator 21 is a piezoelectric resonator adapted to vibrate in a square type vibration mode. A partial electrode 20a is provided on each of the opposite sides of the series resonator 20, and a full electrode 21b is disposed on each of the opposite sides of the parallel resonator 21. The series resonator 20 and the parallel resonator 21 are preferably made from the same ceramic material of a certain desired frequency constant. The distance L between the opposite side edges of the series resonator 20 is substantially equal to that of the parallel resonator 21, but the series resonator 20 is thicker than the parallel resonator 21.

Figure 8A:
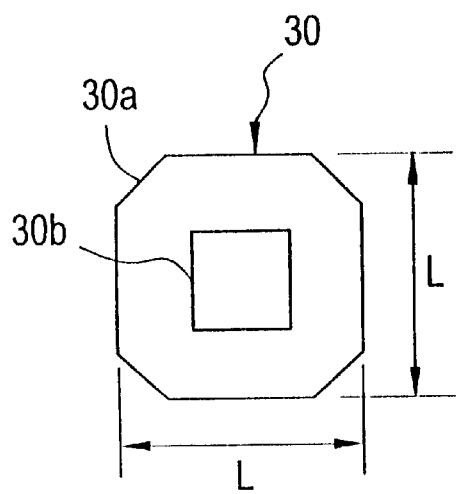
FIGS. 8A and 8B are respective front views of a series resonator and a parallel resonator for use in a ladder-type piezoelectric filter according to a third preferred embodiment of the present invention.
Figure 8B:
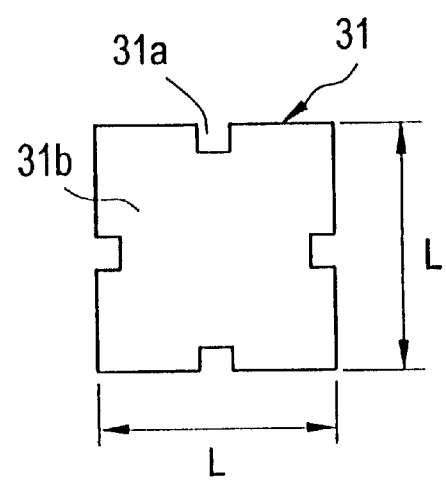

Through adjustment of the depth of the nodal cuts 21a formed in the parallel resonator 21, a predetermined frequency difference is established between the series resonator 20 and the parallel resonator 21. The thus-configured second preferred embodiment achieves advantages and effects similar to those achieved by the first preferred embodiment FIGS. 8A and 8B show a series resonator and a parallel resonator applied to a ladder-type filter according to a third preferred embodiment of the present invention.

In the present preferred embodiment, an element having corner cuts 30a is used as a series resonator 30, and an element having nodal cuts 31a is used as a parallel resonator 31.

Each of the series resonator 30 and the parallel resonator 31 is a piezoelectric resonator adapted to vibrate in a square type vibration mode and having a substantially square shape. A partial electrode 30b is disposed on each of the opposite sides of the series resonator 30, and a full electrode 31b is disposed on each of the opposite sides of the parallel resonator 31. The series resonator 30 and the parallel resonator 31 are preferably made from the same ceramic material of a certain desired frequency constant. The distance L between the opposite side edges of the series resonator 30 is substantially equal to that of the parallel resonator 31, but the series resonator 30 is thicker than the parallel resonator 31.

Through adjustment of the width of the corner cuts 30a of the series resonator 30 or the depth of the nodal cuts 31a of the parallel resonator 31, a predetermined frequency difference is established between the series resonator 30 and the parallel resonator 31. The thus-configured third preferred embodiment achieves the advantages and effects similar to those achieved by the first preferred embodiment.

Figure 9A:
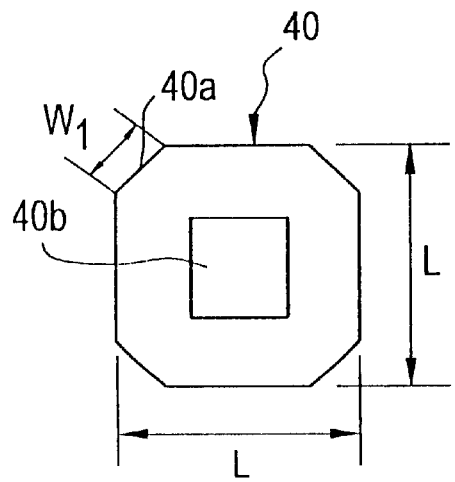
FIGS. 9A and 9B are respective front views of a series resonator and a parallel resonator for use in a ladder-type piezoelectric filter according to a fourth preferred embodiment of the present invention.
Figure 9B:
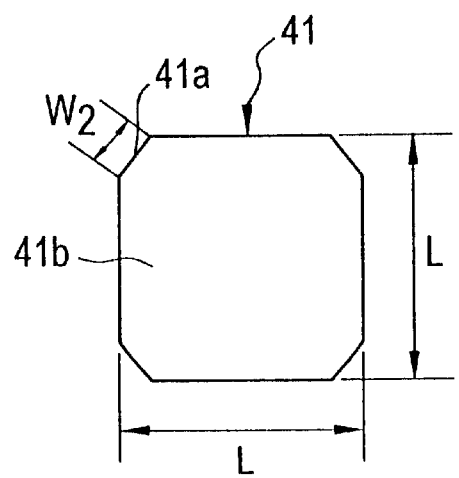

FIGS. 9A and 9B show a series resonator and a parallel resonator applied to a ladder-type filter according to a fourth preferred embodiment of the present invention.

In the present preferred embodiment, a piezoelectric element adapted to vibrate in a square type vibration mode having corner cuts 40a is used as a series resonator 40, and a piezoelectric element adapted to vibrate in a square type vibration mode having corner cuts 41a is used as a parallel resonator 41. Width $w_1$ of the corner cuts 40a of the series resonator 40 is greater than width $w_2$ of the corner cuts 41a of the parallel resonator 41.

A partial electrode 40b is disposed on each of the opposite sides of the series resonator 40, and a full electrode 41b is disposed on each of the opposite sides of the parallel resonator 41. The series resonator 40 and the parallel resonator 41 are preferably made from the same ceramic material of a certain desired frequency constant. The distance L between the opposite side edges of the series resonator 40 is substantially equal to that of the parallel resonator 41, but the series resonator 40 is thicker than the parallel resonator 41.

Through adjustment of the widths $W_1$ and $w_2$ of the corner cuts 40a and 41a, respectively, a predetermined frequency difference is established between the series resonator 40 and the parallel resonator 41. The thus-configured fourth preferred embodiment achieves advantages and effects similar to those achieved by the first preferred embodiment.

Figure 10A:
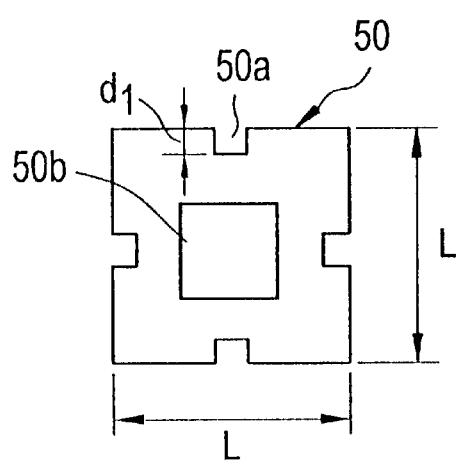
FIGS. 10A and 10B are respective front views of a series resonator and a parallel resonator for use in a ladder-type piezoelectric filter according to a fifth preferred embodiment of the present invention.
Figure 10B:
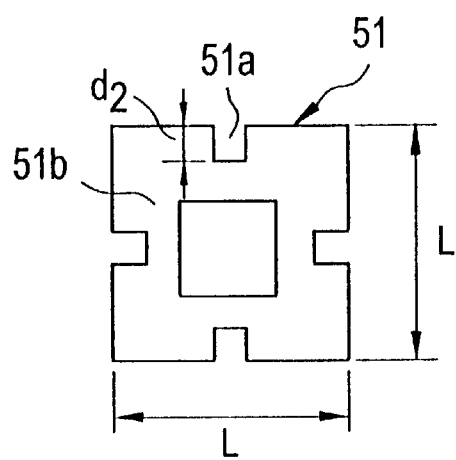

FIGS. 10A and 10B.show a series resonator and a parallel resonator applied to a ladder-type filter according to a fifth preferred embodiment of the present invention.

In the present preferred embodiment, a piezoelectric element adapted to vibrate in a square type vibration mode having nodal cuts 50a is used as a series resonator 50, and a piezoelectric element adapted to vibrate in a square type vibration mode having nodal cuts 51a is used as a parallel resonator 51. A depth $d_1$ of the nodal cuts 50a of the series resonator 50 is shallower than depth $d_2$ of the nodal cuts 51a of the parallel resonator 51.

A partial electrode 50b is disposed on each of the opposite sides of the series resonator 50, and a full electrode 51b is disposed on each of the opposite sides of the parallel resonator 51. The series resonator 50 and the parallel resonator 51 are preferably made from the same ceramic material of a certain desired frequency constant. The distance L between the opposite side edges of the series resonator 50 is substantially equal to that of the parallel resonator 51, but the series resonator 50 is thicker than the parallel resonator 51.

Through adjustment of the depths $d_1$ and $d_2$ of the nodal cuts 50a and 51a, respectively, a predetermined frequency difference is established between the series resonator 50 and the parallel resonator 51. The thus-configured fifth preferred embodiment achieves the advantages and effects similar to those achieved by the first preferred embodiment.

The above preferred embodiments are described such that the number of elements used in the ladder-type filter is at least four as shown in FIGS. 3 and 4. However, any other number of elements may be used. Also, the present invention is not limited to the shape and arrangement of the terminals illustrated in FIGS. 3 and 4. For example, the spring plate 10 is housed within the housing 1 in order to exert a desired spring force on the housed components. However, any of the terminals may assume the form of a spring terminal, thereby eliminating the spring plate 10.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric filter comprising:
    a first piezoelectric element adapted to vibrate in a square type vibration mode, having a substantially square shape, and defining a parallel resonator; and
    a second piezoelectric element adapted to vibrate in a square type vibration mode and defining a series resonator, the second piezoelectric element being made from a material having a frequency constant that is substantially equal to that of a material from which said first piezoelectric element is made, the second piezoelectric element having a substantially square shape such that a distance between opposite side edges thereof is substantially equal to that of said first piezoelectric element and such that each of four corners of the second piezoelectric element is cut.

2. The piezoelectric filter according to claim 1, wherein the first piezoelectric element and the second piezoelectric element are connected to each other so as to define a ladder circuit.

3. The piezoelectric filter according to claim 1, further comprising at least two of the first piezoelectric element and at least two of the second piezoelectric element and. the at least two of the first piezoelectric elements and the at least two of the second piezoelectric elements are connected to each other to define a ladder circuit.

4. The piezoelectric filter according to claim 1, wherein the first and second piezoelectric elements are made from the same ceramic material.

5. The piezoelectric filter according to claim 1, wherein the second piezoelectric element defining the series resonator has a greater thickness than that of the first piezoelectric element defining the parallel resonator.

6. The piezoelectric filter according to claim 1, further comprising a housing containing the first and second piezoelectric elements, wherein the first and second piezoelectric elements are aligned in the housing relative to respective centers of the first and second piezoelectric elements.

7. A piezoelectric filter comprising:
    a first piezoelectric element adapted to vibrate in a square type vibration mode, having a substantially square shape such that each of four corners thereof is cut, and defining a series resonator; and
    a second piezoelectric element adapted to vibrate in a square type vibration mode and defining a parallel resonator, the second piezoelectric element being made from a material having a frequency constant that is substantially equal to that of a material from which said first piezoelectric element is made, the second piezoelectric element having a substantially square shape such that a distance between opposite side edges thereof is substantially equal to that of said first piezoelectric element and such that each of a plurality of nodal portions located at an approximate central portion of a side edge of the second piezoelectric element is cut.

8. The piezoelectric filter according to claim 7, wherein the first piezoelectric element and the second piezoelectric element are connected to each other so as to define a ladder circuit.

9. The piezoelectric filter according to claim 7, wherein the first and second piezoelectric elements are made from the same ceramic material.

10. The piezoelectric filter according to claim 7, wherein the first piezoelectric element defining the series resonator has a greater thickness than that of the second piezoelectric element defining the parallel resonator.

11. The piezoelectric filter according to claim 7, further comprising a housing containing the first and second piezoelectric elements, wherein the first and second piezoelectric elements are aligned in the housing relative to respective centers of the first and second piezoelectric elements.

12. A ladder-type piezoelectric filter comprising:
    a first piezoelectric element adapted to vibrate in a square type vibration mode, having a substantially square shape such that each of four corners thereof is cut to define a cut portion, and defining a series resonator; and a second piezoelectric element adapted to vibrate in a square type vibration mode and defining a parallel resonator, the second piezoelectric element being made from a material having a frequency constant that is substantially equal to that of a material from which said first piezoelectric element is made, the second piezoelectric element having a substantially square shape such that a distance between opposite side edges thereof is substantially equal to that of said first piezoelectric element and such that each of four corners thereof is cut to define a cut portion, wherein each of the cut portions of the second piezoelectric element is narrower than a corresponding one of the cut portions of the first piezoelectric element.

13. The piezoelectric filter according to claim 12, further comprising a housing containing the first and second piezoelectric elements, wherein the first and second piezoelectric elements are aligned in the housing relative to respective centers of the first and second piezoelectric elements.

* * * * *